US008564172B2

(12) United States Patent
Seki et al.

(10) Patent No.: US 8,564,172 B2
(45) Date of Patent: Oct. 22, 2013

(54) ELASTIC WAVE ELEMENT AND ELECTRONIC APPARATUS USING SAME

(75) Inventors: Shun-ichi Seki, Hyogo (JP); Hiroki Kamiguchi, Osaka (JP); Hidekazu Nakanishi, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 51 days.

(21) Appl. No.: 13/260,798

(22) PCT Filed: Apr. 19, 2010

(86) PCT No.: PCT/JP2010/002817
§ 371 (c)(1),
(2), (4) Date: Sep. 28, 2011

(87) PCT Pub. No.: WO2010/122767
PCT Pub. Date: Oct. 28, 2010

(65) Prior Publication Data
US 2012/0019102 A1  Jan. 26, 2012

(30) Foreign Application Priority Data

Apr. 22, 2009 (JP) ................................. 2009-103572

(51) Int. Cl.
*H03H 9/25* (2006.01)
(52) U.S. Cl.
USPC ............... 310/313 R; 310/313 A; 310/313 B; 310/313 C; 310/313 D
(58) Field of Classification Search
USPC ...... 310/313 B, 313 R, 313 A, 313 C, 313 D, 310/363–366; 333/193–199
IPC ....................................................... H03H 9/25
See application file for complete search history.

(56) References Cited

U.S. PATENT DOCUMENTS

| 5,179,310 A * | 1/1993 | Satoh et al. ............... 310/313 B |
| 6,516,503 B1 * | 2/2003 | Ikada et al. ............... 310/313 B |
| 2003/0038562 A1 * | 2/2003 | Ikada et al. ............... 310/313 B |
| 2007/0241841 A1 | 10/2007 | Hauser et al. |

FOREIGN PATENT DOCUMENTS

| JP | 6-152299 A | 5/1994 |
| JP | 2000-196409 A | 7/2000 |
| JP | 2000-341068 A | 12/2000 |
| JP | 2008-508821 A | 3/2008 |

OTHER PUBLICATIONS

International Search Report for PCT/JP2010/002817, Jul. 20, 2010.

* cited by examiner

*Primary Examiner* — Thomas Dougherty
*Assistant Examiner* — Karen B Addison
(74) *Attorney, Agent, or Firm* — RatnerPrestia (57) ABSTRACT

An acoustic wave element includes a piezoelectric body, first and second interdigital transducer (IDT) electrodes provided on an upper surface of the piezoelectric body, and a first dielectric layer provided on the upper surface of the piezoelectric body to cover the first and second IDT electrodes. The first dielectric layer has a first part directly above the first IDT electrode and a second part directly above the second IDT electrode. The height of an upper surface of the second part of the first dielectric layer is larger than the height of an upper surface of the first part of the first dielectric layer. This acoustic wave element has a preferable temperature characteristic and electromechanical coupling factor.

19 Claims, 7 Drawing Sheets

ELASTIC WAVE ELEMENT AND ELECTRONIC APPARATUS USING SAME

This application is a U.S. National Phase Application of PCT International application PCT/JP2010/002817.

TECHNICAL FIELD

The present invention relates to an acoustic wave element and an electronic apparatus including the element.

BACKGROUND ART

Figure 10:
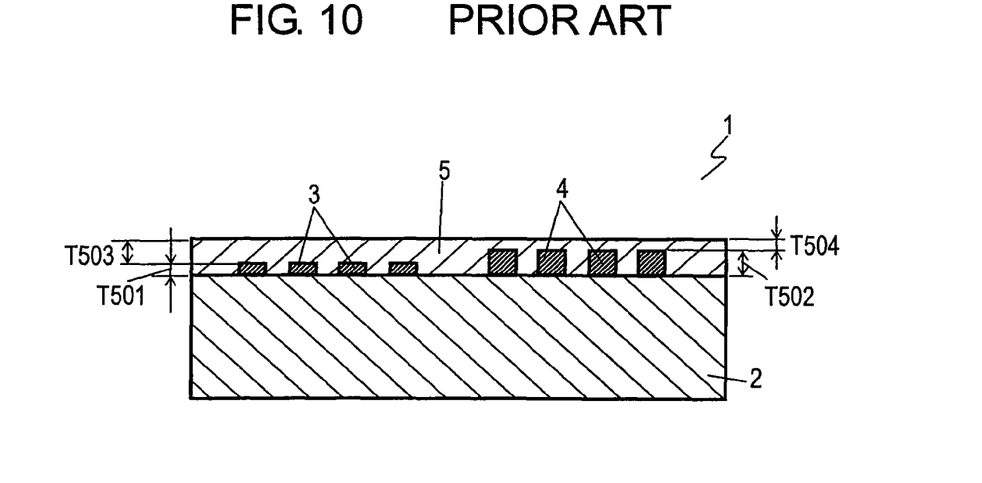
FIG. 10 is a schematic sectional view of a conventional acoustic wave element.

FIG. 10 is a schematic sectional view of conventional acoustic wave element 1 described in patent literature 1. Acoustic wave element 1 is an antenna duplexer complying with the CDMA standard for band 1 for instance, including a receiving filter passing signals in a receiving frequency band from 2,110 MHz to 2,170 MHz and a transmitting filter passing signals in a transmitting frequency band from 1,920 MHz to 1,980 MHz which is lower than the receiving frequency band.

Acoustic wave element 1 includes piezoelectric body 2 made of a piezoelectric material, such as lithium niobate or lithium tantalite, interdigital transducer (IDT) electrode 3 provided on piezoelectric body 2 as an electrode of a resonator of the receiving filter, and IDT electrode 4 provided on piezoelectric body 2 as an electrode of a resonator of the transmitting filter. Wavelength λ501 of an acoustic wave propagating through IDT electrode 3 of the receiving filter is shorter than wavelength λ502 of an acoustic wave propagating through IDT electrode 4 of the transmitting filter.

Thickness T502 of IDT electrode 4 is greater than thickness T501 of IDT electrode 3 to roughly equalize normalized thicknesses N501 and N502, where normalized thickness N501 is obtained by dividing thickness T501 of IDT electrode 3 of the receiving filter by wavelength λ501 of the acoustic wave, and normalized thickness N502 is obtained by dividing thickness T502 of IDT electrode 4 of the transmitting filter by wavelength λ502 of the acoustic wave. This structure improves an electromechanical coupling factor of acoustic wave element 1.

Acoustic wave element 1 includes dielectric layer 5 made of, e.g. silicon oxide (SiO$_2$) provided on piezoelectric body 2 to cover electrodes 3 and 4. Dielectric layer 5 has a temperature characteristic inverse to that of piezoelectric body 2 to improve temperature characteristics of acoustic wave element 1. An upper surface of dielectric layer 5 is flat from above IDT electrode 3 to above IDT electrode 4. In acoustic wave element 1, the transmitting filter including IDT electrode 4 has an inferior temperature characteristic, and the receiving filter including IDT electrode 3 has an inferior electromechanical coupling factor.

PRIOR ART DOCUMENT

Patent Literature

Patent literature 1: Japanese Patent Laid-Open Publication No. 2008-508821

SUMMARY OF THE INVENTION

An acoustic wave element includes a piezoelectric body, first and second interdigital transducer (IDT) electrodes provided on an upper surface of the piezoelectric body, and a first dielectric layer provided on the upper surface of the piezoelectric body to cover the first and second IDT electrodes. The first dielectric layer has a first part directly above the first IDT electrode and a second part directly above the second IDT electrode. The height of an upper surface of the second part of the first dielectric layer is larger than the height of an upper surface of the first part of the first dielectric layer.

This acoustic wave element has a preferable temperature characteristic and electromechanical coupling factor,

DETAILED DESCRIPTION OF PREFERRED EMBODIMENTS

Exemplary Embodiment 1

Figure 1:
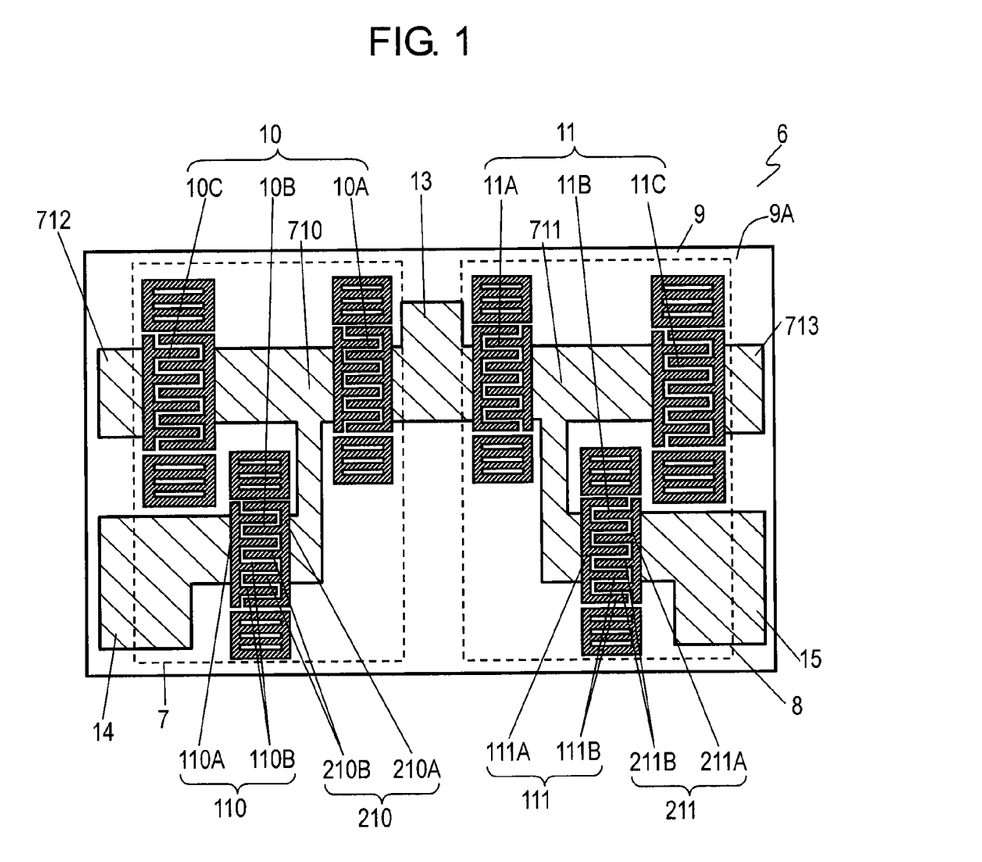
FIG. 1 is a top view of an acoustic wave element according to Exemplary Embodiment 1 of the present invention.
Figure 2:
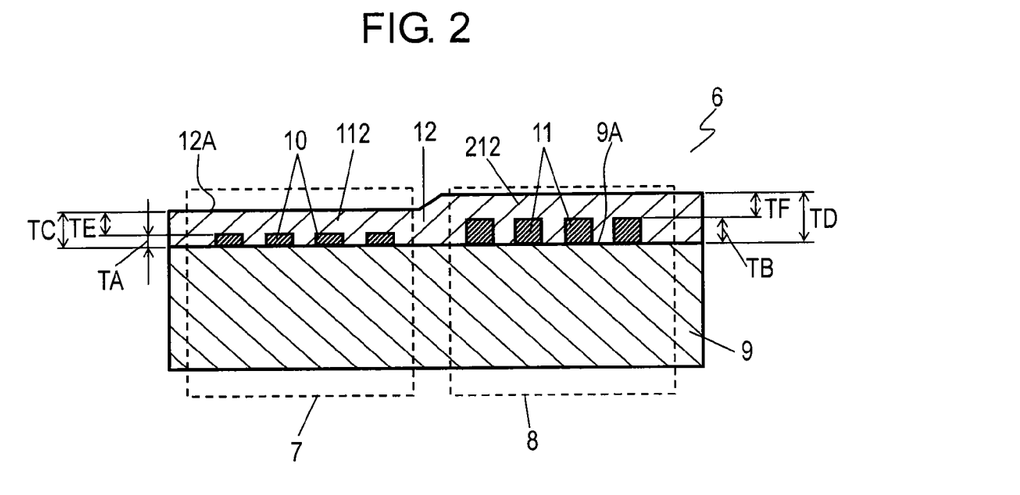
FIG. 2 is a schematic sectional view of the acoustic wave element according to Embodiment 1.

FIGS. 1 and 2 are a top view and a schematic sectional view of acoustic wave element 6 according to Exemplary Embodiment 1 of the present invention, respectively. Acoustic wave element 6 is an antenna duplexer complying with the CDMA standard for band 1 for instance, including filters 7 and 8. Filter 7 is a receiving filter passing signals in a receiving frequency band from 2,110 MHz to 2,170 MHz. Filter 8 is a transmitting filter passing signals in a transmitting frequency band from 1,920 MHz to 1,980 MHz which is lower than the receiving frequency band.

Acoustic wave element 6 includes piezoelectric body 9, interdigital transducer (IDT) electrodes 10 and 11 provided on upper surface 9A of piezoelectric body 9, and dielectric layer 12 provided on upper surface 9A of piezoelectric body 9 and covering IDT electrodes 10 and 11. IDT electrode 10 includes comb-shaped electrodes 110 and 210 facing each other. Comb-shaped electrode 110 includes bus bar 110A and plural electrode fingers 110B extending from bus bar 110A in parallel to one another. Comb-shaped electrode 210 includes bus bar 210A and plural electrode fingers 110B extending from bus bar 210A in parallel to one another and interdigitated with plural electrode fingers 110B. Comb-shaped electrode 111 includes bus bar 111A and plural electrode fingers 111B extending from bus bar 111A parallel to one another. Comb-shaped electrode 211 includes bus bar 211A and plural electrode fingers 111B extending from bus bar 211A parallel to one another and interdigitated with plural electrode fingers 211B.

Filter 7, a receiving filter, includes series resonator 10A connected to antenna terminal 13, series resonator 10B connected in series to series resonator 10A at node 710, output terminal 14 connected to series resonator 10B, and parallel resonator 10C connected between node 710 and ground terminal 712. IDT electrode 10 functions as an IDT electrode of each of resonators 10A to 10C.

Filter 8, a transmitting filter, includes series resonator 11A connected to antenna terminal 13, series resonator 11B connected in series to series resonator 11A at node 711, input terminal 15 connected to series resonator 11B, and parallel resonator 11C connected between node 711 and ground terminal 713. IDT electrode 11 functions as an IDT electrode of each of resonators 11A to 11C.

Filter 7 constituted by IDT electrode 10 is a receiving filter passing signals in a receiving frequency band. Filter 8 constituted by IDT electrode 11 is a transmitting filter passing signals in a transmitting frequency band lower than the receiving frequency band. Hence, wavelength λ1 of an acoustic wave propagating through IDT electrode 10 is shorter than wavelength λ2 of an acoustic wave propagating through IDT electrode 11.

Piezoelectric body 9 is made of a lithium niobate-based piezoelectric material, however, may be made of another piezoelectric material, such as crystal, lithium tantalite-based material, or potassium niobate-based material.

IDT electrodes 10 and 11 are made of a metal mainly containing copper; however, may be made of a single metal, such as aluminum, silver, gold, titanium, tungsten, platinum, chromium, or molybdenum, or another metal such as an alloy mainly containing at least one of these metals.

For IDT electrodes 10 and 11 mainly containing copper, thickness TA of IDT electrode 10 is not smaller than 1,550 Å and is smaller than 1,650 Å, thickness TB of IDT electrode 11 is not smaller than 1,650 Å and is smaller than 1,750 Å, for instance. That is, thickness TB of IDT electrode 11 is larger than thickness TA of IDT electrode 10. This arrangement allows substantially equalizing the following two normalized thicknesses. One normalized thickness is obtained by dividing thickness TA of IDT electrode 10 by wavelength λ1 of an acoustic wave. The other normalized thickness is obtained by dividing thickness TB of IDT electrode 11 by wavelength λ2. This structure improves an electromechanical coupling factor of acoustic wave element 6.

Dielectric layer 12 is made of a dielectric material, such as silicon oxide, having a frequency temperature characteristic inverse to that of piezoelectric body 9, which improves the frequency temperature characteristic of acoustic wave element 6. Silicon oxide is a medium transmitting a transverse wave having a velocity lower than that of a transverse wave that propagates in piezoelectric body 9.

In conventional acoustic wave element 1 shown in FIG. 10, an upper surface of dielectric layer 5 is flat above IDT electrodes 3 and 4. Since thickness T502 of IDT electrode 4 of the transmitting filter is thicker, thickness T504 of dielectric layer 5 is thinner than thickness T503 of dielectric layer 5 of the receiving filter. Hence, the transmitting filter has an inferior in temperature characteristic, and the receiving filter has an inferior electromechanical coupling factor.

In dielectric layer 12 made of silicon oxide, height TC of upper surface 12A of dielectric layer 12 directly above IDT electrode 10 is not smaller than 3,950 Å and is smaller than 4,050 Å measured from upper surface 9A of piezoelectric body 9, for instance. Height TD of upper surface 12A of dielectric layer 12 directly above IDT electrode 11 is not smaller than 4,050 Å and is smaller than 4,150 Å measured from upper surface 9A of piezoelectric body 9. In other words, height TD of upper surface 12A of part 212 of dielectric layer 12 directly above IDT electrode 11 measured from upper surface 9A of piezoelectric body 9 is larger than height TC of upper surface 12A of part 112 of dielectric layer 12 directly above IDT electrode 10 measured from upper surface 9A of piezoelectric body 9. This structure substantially equalizes thickness TF of dielectric layer 12 at part 212 with thickness TE of dielectric layer 12 at part 112 (e.g. 2,400 Å). This structure improves both the temperature characteristic and the electromechanical coupling factor.

Thickness TF of dielectric layer 12 at part 212 is not smaller than thickness TE at part 112 (e.g. 2,400 Å). At the same time, the normalized thickness obtained by dividing thickness TF of dielectric layer 12 at part 212 by wavelength λ2 is preferably not larger than the normalized thickness obtained by dividing thickness TE of part 112 by wavelength λ1. For example, thickness TF is not larger than 2,550 Å. This structure further improves the temperature characteristic and the electromechanical coupling factor of acoustic wave element 6.

Particularly, thickness TF of dielectric layer 12 at part 212 is preferably larger than thickness TE (e.g. 2,400□) at part 112. At the same time, the normalized thickness obtained by dividing thickness TF of dielectric layer 12 at part 212 by wavelength λ2 is preferably smaller than the normalized thickness obtained by dividing thickness TE (e.g. 2,550 Å) at part 112 by wavelength λ1. This structure further improves the temperature characteristic and the electromechanical coupling factor of acoustic wave element 6.

Figure 3:
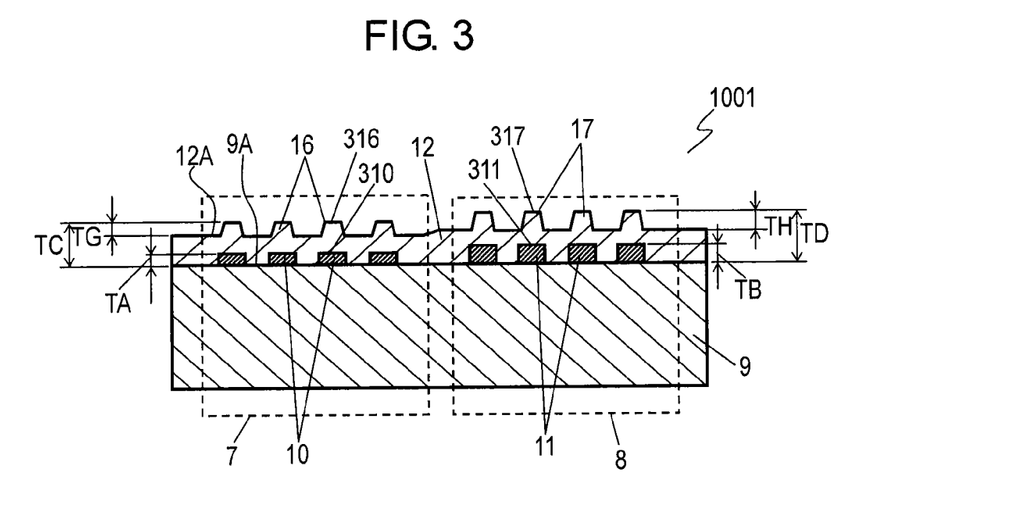
FIG. 3 is a schematic sectional view of another acoustic wave element according to Embodiment 1.

FIG. 3 is a schematic sectional view of another acoustic wave element 1001 according to Embodiment 1. In FIG. 3, components identical to those of acoustic wave element 6 shown in FIGS. 1 and 2 are denoted by the same reference numerals. In acoustic wave element 1001, upper surface 12A of dielectric layer 12 has projection 16 positioned directly above IDT electrode 10 and projection 17 positioned directly above IDT electrode 11. Projections 16 and 17 extend along IDT electrodes 10 and 11 shown in FIG. 1, respectively. Projection 16 has height TG from its root to its upper surface which is not smaller than 1,500 Å and is smaller than 1,600 Å. Projection 17 has height TH from its root to its upper surface which is not smaller than 1,600 Å and is smaller than 1,700 Å. Height TH of projection 17 larger than height TG of projection 16 further improves the temperature characteristic and the electromechanical coupling factor of acoustic wave element 6. IDT electrode 11 of filter 8, a transmitting filter, receives a transmission signal amplified by a power amplifier input thereto. The transmission signal may cause IDT electrode 11 to heat and to deteriorate. Height TH of projection 17 positioned directly above IDT electrode 11 larger than height TG of projection 16 positioned directly above IDT electrode 10 allows IDT electrode 10 to discharge heat efficiently.

Figure 4:
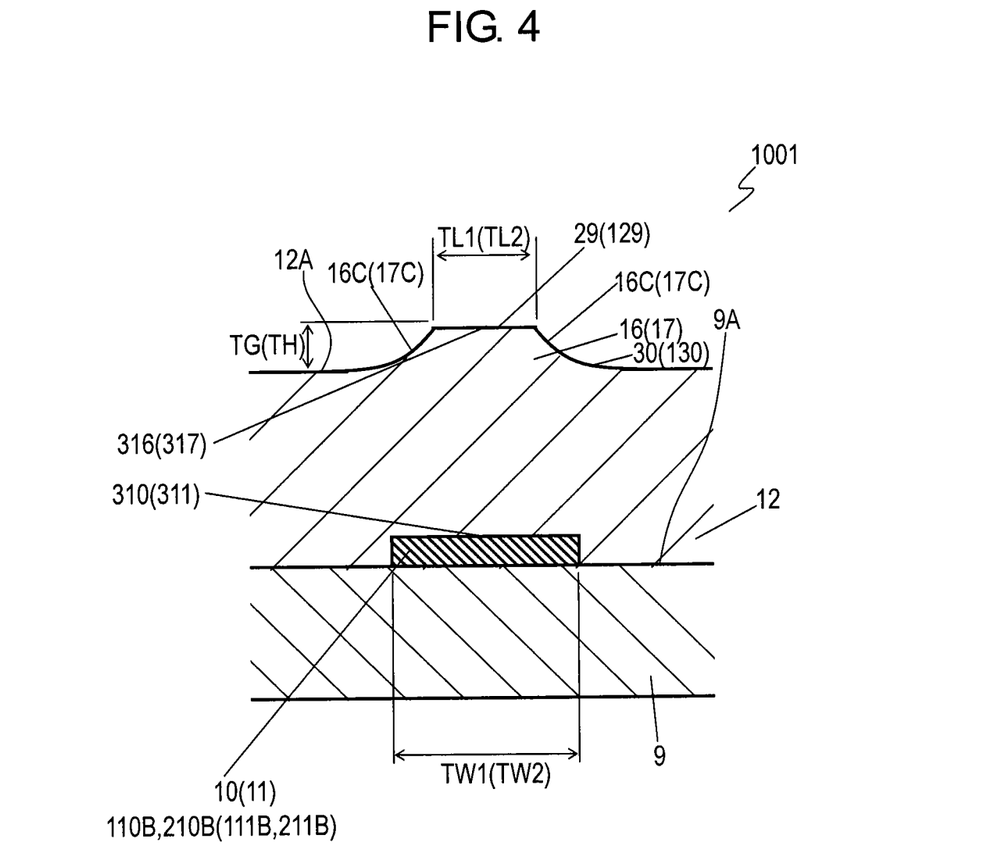
FIG. 4 is an enlarged sectional view of the acoustic wave element shown in FIG. 3.

FIG. 4 is an enlarged sectional view of acoustic wave element 1001 for illustrating projections 16 and 17 of dielectric layer 12. Projection 16 has top 29, root 30, and side surfaces 16C connected to top 29 and root 30. Side surface 16C preferably has a concave, curved cross section. Width TL1 of top 29 is the distance between two points where a straight line containing top 29 and being parallel to upper surface 9A of piezoelectric body 9 crosses side surfaces 16C or their extending lines. Width TL1 is smaller than width TW1 of electrode fingers 110B and 210B of IDT electrode 10. This structure allows the mass of a portion of dielectric layer 12 around electrode 10 to change continuously and gradually at projection 16. This structure improves electrical characteristics of acoustic wave element 6 while eliminating or reducing unnecessary reflection resulting from the shape of dielectric layer 12.

Projection 17 has top 129, root 130, and side surfaces 17C connected to top 129 and root 130. Side surface 17C preferably has a concave, curved cross section. Width TL2 of top 129 is the distance between two points where a straight line containing top 129 and being parallel to upper surface 9A of piezoelectric body 9 crosses side surfaces 17C or their extending lines. Width TL2 is smaller than width TW2 of electrode fingers 111B and 211B of IDT electrode 11. This structure allows the mass of dielectric layer 12 to change continuously and gradually at projection 17. This structure improves electrical characteristics of acoustic wave element 6 while eliminating or reducing unnecessary reflection resulting from the shape of dielectric layer 12.

Width TL1 of top 29 of projection 16 is preferably not larger than ½ of width TW1 of each of electrode fingers 110B and 210B of IDT electrode 10. Further, center 316 of top 29 is preferably positioned directly above center 310 of electrode fingers 110B and 210B. This structure further increases the reflectivity at electrode fingers 110B and 210B due to the mass addition effect, thereby improving the electrical characteristics of acoustic wave element 6.

Width TL2 of top 129 of projection 17 is preferably not larger than ½ of width TW2 of electrode fingers 111B and 211B of IDT electrode 11. Further, center 317 of top 129 is preferably positioned directly above center 311 of electrode fingers 111B and 211B. This structure further increases the reflectivity at electrode fingers 111B and 211B due to the mass addition effect, thereby improving the electrical characteristics of acoustic wave element 6.

Heights TG and TH of projections 16 and 17, thickness TA of IDT electrode 10, thickness TB of IDT electrode 11, and wavelengths λ1 and λ2 preferably satisfy the relations: 0.03×λ1<TG≤TA, and 0.03×λ2<TH≤TB. If height TG of projection 16 exceeds 0.03×λ1, or if height TH of projection 17 exceeds 0.03×λ2, the reflectivity exceeds that of conventional acoustic wave element 1 shown in FIG. 10, thus providing a superior performance. Meanwhile, if height TG of projection 16 exceeds thickness TA of IDT electrode 10, or if height TH of projection 17 exceeds thickness TB of IDT electrode 11, an additional process for producing dielectric layer 12 is required, which makes the manufacturing troublesome.

FIGS. 5A to 5H are sectional views of acoustic wave element 1001 for illustrating processes for manufacturing acoustic wave element 1001.

Figure 5A:
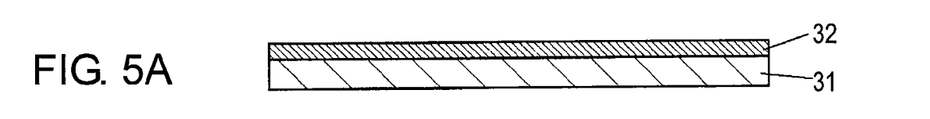
FIG. 5A is a sectional view of the acoustic wave element shown in FIG. 3 for illustrating a process of manufacturing the element.

First, as shown in FIG. 5A, electrode film 32 to be electrodes and reflectors is formed by depositing or sputtering Al or Al alloy on the upper surface of piezoelectric body 31.

Figure 5B:
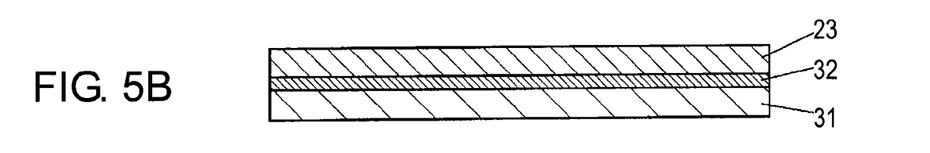
FIG. 5B is a sectional view of the acoustic wave element shown in FIG. 3 for illustrating a process of manufacturing the element.

Then, as shown in FIG. 5B, resist film 33 is formed on an upper surface of electrode film 32.

Figure 5C:
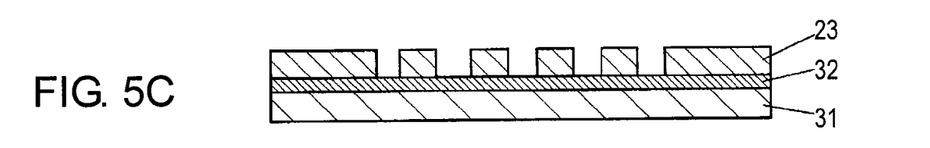
FIG. 5C is a sectional view of the acoustic wave element shown in FIG. 3 for illustrating a process of manufacturing the element.

Further, as shown in FIG. 5C, resist film 33 is exposed and developed to have a predetermined shape.

Figure 5D:
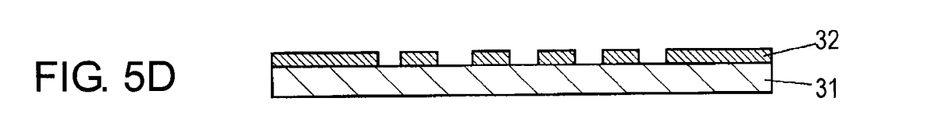
FIG. 5D is a sectional view of the acoustic wave element shown in FIG. 3 for illustrating a process of manufacturing the element.

Further, as shown in FIG. 5D, electrode film 32 is processed by, e.g. dry etching to have a predetermined shape, such as IDT electrodes 10 and 11a and a reflector. Then, resist film 33 is removed.

Figure 5E:
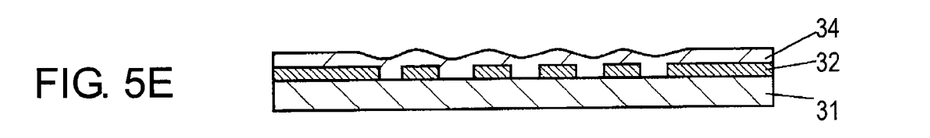
FIG. 5E is a sectional view of the acoustic wave element shown in FIG. 3 for illustrating a process of manufacturing the element.

Next, as shown in FIG. 5E, dielectric layer 34 is formed by depositing or sputtering silicon oxide to cover electrode film 32. To produce projections 16 and 17, bias sputtering is used, in which silicon oxide is sputtered while a bias voltage is applied on piezoelectric body 31.

For instance, dielectric layer 34 is deposited on piezoelectric body 31 by sputtering a target of silicon oxide, and simultaneously part of dielectric layer 34 on piezoelectric body 31 is removed by sputtering with a bias voltage. That is, while dielectric layer 34 is deposited, part of dielectric layer 34 is removed to control the shape of dielectric layer 34. Alternatively, the shape of dielectric layer 34 may be controlled by changing the power ratio of a bias voltage applied on piezoelectric body 31 to the sputtering power during the depositing of dielectric layer 34. Besides, the shape of dielectric layer 34 can be controlled by forming a film without applying a bias on piezoelectric body 31 at first, and then by applying a bias simultaneously with forming a film from halfway. In this case, the temperature of piezoelectric body 31 is controlled as well.

Figure 5F:
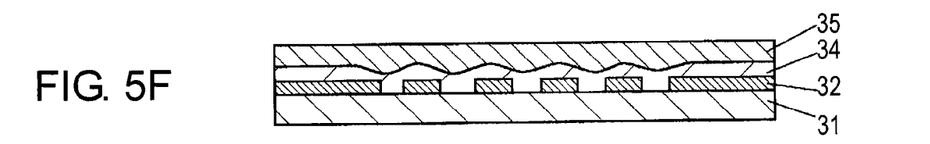
FIG. 5F is a sectional view of the acoustic wave element shown in FIG. 3 for illustrating a process of manufacturing the element.

Further, as shown in FIG. 5F, resist film 35 is formed on the surface of dielectric layer 34.

Figure 5G:
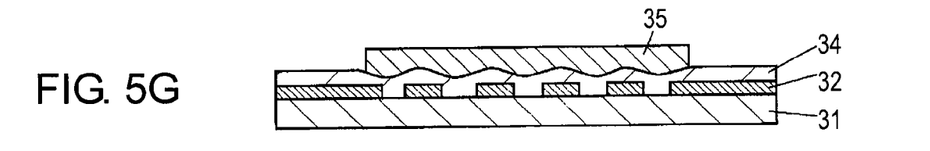
FIG. 5G is a sectional view of the acoustic wave element shown in FIG. 3 for illustrating a process of manufacturing the element.

Further, as shown in FIG. 5G, resist film 35 is exposed and developed to process resist film 35 to a predetermined shape.

Figure 5H:
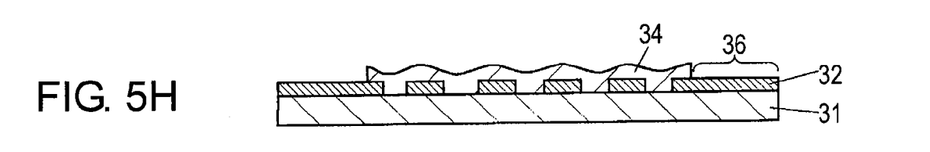
FIG. 5H is a sectional view of the acoustic wave element shown in FIG. 3 for illustrating a process of manufacturing the element.

Next, as shown in FIG. 5H, unnecessary part of dielectric layer 34 is removed, by, e.g. dry etching, to expose pad 36 for extracting electric signals, and then, resist film 35 is removed.

Finally, piezoelectric body 31 is divided by dicing to produce acoustic wave element 1001.

Figure 6:
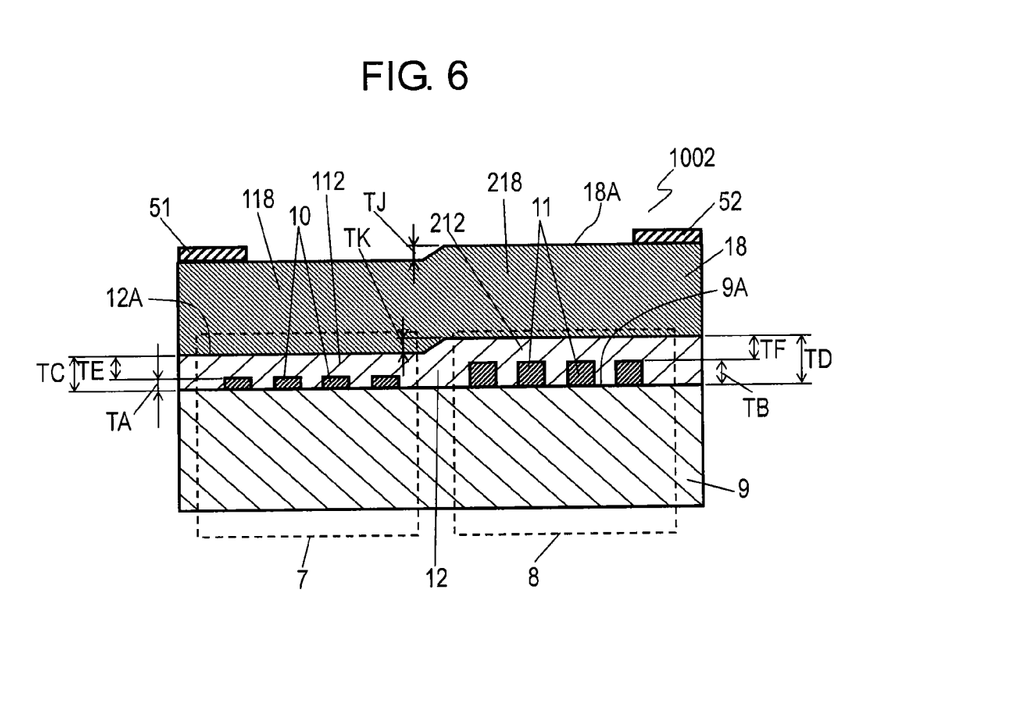
FIG. 6 is a schematic sectional view of still another acoustic wave element according to Embodiment 1.

FIG. 6 is a schematic sectional view of still another acoustic wave element 1002 according to Embodiment 1. In FIG. 6, components identical to those of acoustic wave element 6 shown in FIGS. 1 and 2 are denoted by the same reference numerals. Acoustic wave element 1002 further includes dielectric layer 18 provided on upper surface 12A of dielectric layer 12. Dielectric layer 18 transmits transverse waves having a velocity higher than that of transverse waves that propagate through dielectric layer 12. Dielectric layer 18 is made of a dielectric material, such as diamond, silicon, silicon nitride, aluminum nitride, or aluminum oxide. The thickness of dielectric layer 18 is larger than thickness TC or thickness TD of dielectric layer 12, 0.8 times or more of the wavelength of a shear horizontal (SH) wave as a main wave. This structure causes the main wave to be trapped in acoustic wave element 1002. If the thickness of dielectric layer 18 is not smaller than the wavelength of an SH wave (the main wave), the main wave can be trapped in acoustic wave element 1002 substantially completely. Acoustic wave element 1002 further includes external terminal 51 provided on upper surface 18A of dielectric layer 18 and electrically connected to IDT electrode 10, and external terminal 52 provided on upper surface 18A of dielectric layer 18 and electrically connected IDT electrode 11. Difference TJ between the height of upper surface 18A of part 118 of dielectric layer 18 directly above IDT electrode 10 and the height of upper surface 18A of part 218 of dielectric layer 18 directly above IDT electrode 11 is preferably smaller than difference TK between height TC of part 112 of dielectric layer 12 directly above IDT electrode 10 and height TD of part 212 of dielectric layer 12 directly above IDT electrode 11. This structure reduces the difference between the heights of external terminals 51 and 52, and allows acoustic wave element 1002 to be connected onto a motherboard reliably through external terminals 51 and 52 by bump connection.

Figure 7A:
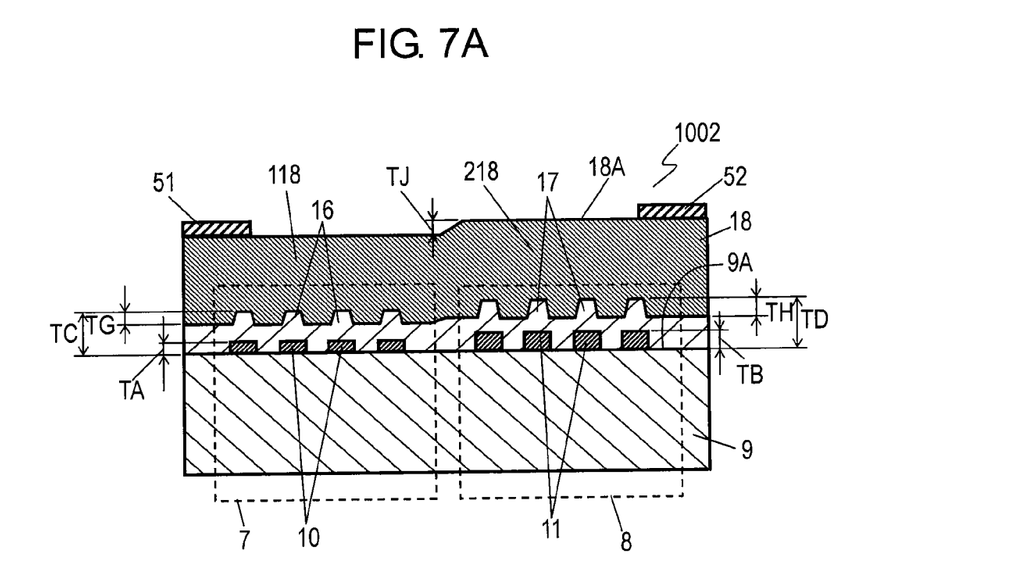
FIG. 7A is a schematic sectional view of a further acoustic wave element according to Embodiment 1.

FIG. 7A is a schematic sectional view of further acoustic wave element 1003 according to Embodiment 1. In FIG. 7A, components identical to those of wave element 1001 shown in FIG. 3 are denoted by the same reference numerals. Acoustic wave element 1003 further includes dielectric layer 18 provided on upper surface 12A of dielectric layer 12, and external terminals 51 and 52. Acoustic wave element 1003 provides the same advantage as acoustic wave element 1002 shown in FIG. 6 due to projections 16 and 17.

According to Embodiment 1, filter 7 is a receiving filter, and filter 8 is a transmitting filter. Filter 7 may be a transmitting filter, and filter 8 may be a receiving filter. Both filters 7 and 8 may be receiving filters or transmitting filters.

Figure 7B:
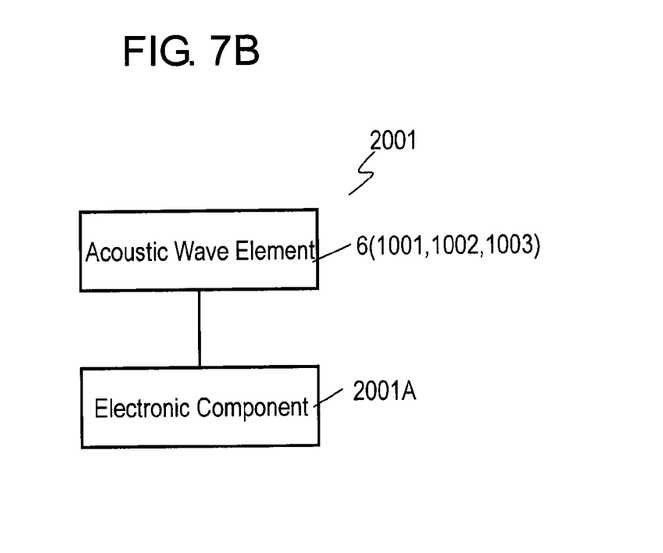
FIG. 7B is a block diagram of an electronic apparatus according to Embodiment 1.

FIG. 7B is a block diagram of electronic apparatus 2001 according to Embodiment 1. Electronic apparatus 2001 includes acoustic wave element 6 (1001, 1002, 1003) and electronic component 2001A, such as a semiconductor integrated circuit element or a loudspeaker, connected to the acoustic wave element. The semiconductor integrated circuit element is connected to acoustic wave element 6 (1001, 1002, 1003) and the loudspeaker is connected to the semiconductor integrated circuit element.

Exemplary Embodiment 2

Figure 8:
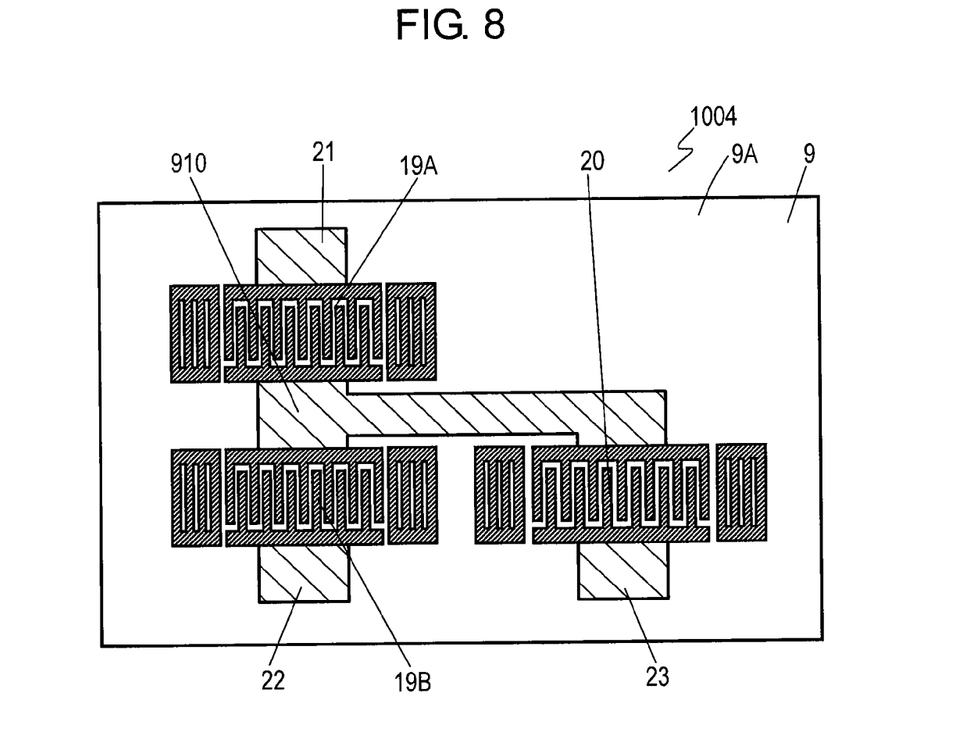
FIG. 8 is a top view of an acoustic wave element according to Exemplary Embodiment 2 of the invention.
Figure 9:
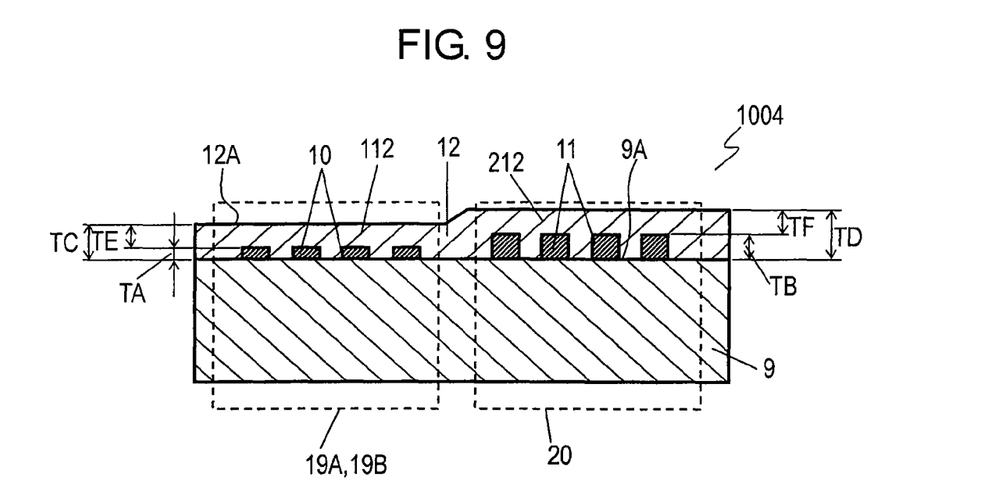
FIG. 9 is a sectional view of the acoustic wave element according to Embodiment 2.

FIGS. 8 and 9 are a top view and a schematic sectional view of acoustic wave element 1004 according to Exemplary Embodiment 2, respectively. In FIGS. 8 and 9, components identical to those of acoustic wave element 6 shown in FIGS. 1 and 2 are denoted by the same reference numerals.

Acoustic wave element 1004 is a ladder-type filter contained in the transmitting filter in an antenna duplexer complying with the CDMA standard for band 1, including series resonators 19A and 19B and parallel resonator 20. Series resonators 19A and 19B are connected in series at node 910. Acoustic wave element 1004 includes input terminal 21 connected to series resonator 19A, output terminal 22 connected to series resonator 19B, and ground terminal 23 connected to parallel resonator 20. Parallel resonator 20 is connected between node 910 and ground terminal 23. Series resonators 19A and 19B have a resonance frequency of 2,050 MHz. Parallel resonator 20 has a resonance frequency of 1,960 MHz lower than the resonance frequency of series resonators 19A and 19B.

Parallel resonator 20 includes IDT electrode 11 shown in FIG. 1, and series resonators 19A and 19B includes IDT electrode 10 shown in FIG. 1. Similarly to acoustic wave element 6 shown in FIG. 2, thickness TB of IDT electrode 11 is larger than thickness TA of IDT electrode 10. For IDT electrodes 10 and 11 mainly containing, e.g. copper, thickness TA of IDT electrode 10 is not smaller than 1,650 Å and is smaller than 1,680 Å, and thickness TB of IDT electrode 11 is not smaller than 1,730 Å and is smaller than 1,760 Å. An acoustic wave with the resonance frequency of series resonators 19A and 19B propagating through piezoelectric body 9 has wavelength $\lambda 1$, and an acoustic wave with the resonance frequency of parallel resonator 20 has wavelength $\lambda 2$. Wavelength $\lambda 1$ is shorter than wavelength $\lambda 2$. The normalized thickness obtained by dividing thickness TA of IDT electrode 10 of series resonators 19A and 19B by wavelength $\lambda 1$ can be substantially identical to the normalized thickness obtained by dividing thickness TB of IDT electrode 11 of parallel resonator 20 by wavelength $\lambda 2$, thereby improving an electromechanical coupling factor of acoustic wave element 1004.

Height TD of upper surface 12A of part 212 of dielectric layer 12 directly above IDT electrode 11 measured from piezoelectric body 9 is larger than height TC of upper surface 12A of part 112 of dielectric layer 12 directly above IDT electrode 10. This structure can make thickness TF of part 212 of dielectric layer 12 substantially identical to thickness TE (2,400 Å) of part 112 of dielectric layer 12, thereby improving both the temperature characteristics and the electromechanical coupling factor of acoustic wave element 1004.

In Embodiments 1 and 2, terms, such as "upper surface," "lower surface," and "directly above", indicating directions indicates relative directions depending only on relative, positional relationships between components of an acoustic wave element, and do not indicate absolute directions, such as a vertical direction.

INDUSTRIAL APPLICABILITY

An acoustic wave element according to the present invention has a preferable temperature characteristic and electromechanical coupling factor, and is applicable to an electronic apparatus, such as a mobile phone.

REFERENCE MARKS IN THE DRAWINGS

7 Filter (First Filter)
8 Filter (Second Filter)
9 Piezoelectric Body
10 IDT Electrode (First IDT Electrode)
11 IDT Electrode (Second IDT Electrode)
12 Dielectric Layer (First Dielectric Layer)
16 Projection (First Projection)
17 Projection (Second Projection)
18 Dielectric Layer (Second Dielectric Layer)
19A Series Resonator
20 Parallel Resonator
51 External Terminal (First External Terminal)
52 External Terminal (Second External Terminal)
110B Electrode Finger (First Electrode Finger)
111B Electrode Finger (Second Electrode Finger)

The invention claimed is:
1. An acoustic wave element comprising:
a piezoelectric body having an upper surface;
a first interdigital transducer (IDT) electrode provided on the upper surface of the piezoelectric body;
a second IDT electrode provided on the upper surface of the piezoelectric body; and
a first dielectric layer provided on the upper surface of the piezoelectric body to cover the first IDT electrode and the second IDT electrode,
wherein the first dielectric layer has a first part directly above the first IDT electrode and a second part directly above the second IDT electrode, and
wherein a height of an upper surface of the second part of the first dielectric layer is larger than a height of an upper surface of the first part of the first dielectric layer,
wherein an upper surface of the first dielectric layer has:

a first projection positioned directly above the first IDT electrode and extending along the first IDT electrode; and
a second projection positioned directly above the second IDT electrode and extending along the second IDT electrode, and
wherein a height of the second projection is larger than a height of the first projection.

2. The acoustic wave element according to claim 1,
wherein a thickness of the second part of the first dielectric layer is not smaller than a thickness of the first part of the first dielectric layer, and
wherein a normalized thickness of the second part of the first dielectric layer is not larger than a normalized thickness of the first part of the first dielectric layer.

3. The acoustic wave element according to claim 1,
wherein the first IDT electrode has a first electrode finger, and
wherein a width of a top of the first projection is not larger than ½ of a width of the first electrode finger.

4. The acoustic wave element according to claim 3, wherein a center of the top of the first projection is positioned substantially directly above a center of the first electrode finger.

5. The acoustic wave element according to claim 3,
wherein the second IDT electrode has a second electrode finger, and
wherein a width of a top of the second projection is not larger than ½ of a width of the second electrode finger.

6. The acoustic wave element according to claim 5, wherein a center of the top of the second projection is positioned substantially directly above a center of the second electrode finger.

7. The acoustic wave element according to claim 1, wherein height TG of the first projection, thickness TA of the first IDT electrode, and wavelength $\lambda 1$ of an acoustic wave propagating through the first IDT electrode satisfy a relation: $0.03 \times \lambda 1 < TG \leq TA$.

8. The acoustic wave element according to claim 7, wherein height TH of the second projection, thickness TB of the second IDT electrode, and wavelength $\lambda 2$ of an acoustic wave propagating through the second IDT electrode satisfy a relation: $0.03 \times \lambda 2 < TH \leq TB$.

9. The acoustic wave element according to claim 1,
wherein the first IDT electrode constitutes a first filter passing a signal in a first frequency band, and
wherein the second IDT electrode constitutes a second filter passing a signal in a second frequency band lower than the first frequency band.

10. The acoustic wave element according to claim 1,
wherein the first IDT electrode forms a series resonator having a first resonance frequency;
wherein the second IDT electrode forms a parallel resonator having a second resonance frequency lower than the first resonance frequency, and
wherein the series resonator and the parallel resonator constitute a ladder-type filter.

11. An electronic apparatus comprising:
the acoustic wave element according to claim 1; and
an electronic component connected to the acoustic wave element.

12. The acoustic wave element according to claim 1, wherein the second IDT electrode has a thickness larger than a thickness of the first IDT electrode.

13. An acoustic wave element comprising:
a piezoelectric body having an upper surface;
a first interdigital transducer (IDT) electrode provided on the upper surface of the piezoelectric body;
a second IDT electrode provided on the upper surface of the piezoelectric body;
a first dielectric layer provided on the upper surface of the piezoelectric body to cover the first IDT electrode and the second IDT electrode;
a second dielectric layer provided on an upper surface of the first dielectric layer, and allows a transverse wave to transmit faster than a transverse wave transmitting through the first dielectric layer;
a first external terminal provided on an upper surface of the second dielectric layer and electrically connected to the first IDT electrode; and
a second external terminal provided on an upper surface of the second dielectric layer and electrically connected to the second IDT electrode,
wherein the first dielectric layer has a first part directly above the first iDT electrode and a second part directly above the second IDT electrode,
wherein a height of an upper surface of the second part of the first dielectric layer is larger than a height of an upper surface of the first part of the first dielectric layer, and
wherein a difference between a height of the upper surface of the second dielectric layer above the first IDT electrode and a height of the upper surface of the second dielectric layer above the second IDT electrode is smaller than a difference between a height of the upper surface of the first dielectric layer above the first IDT electrode and a height of the upper surface of the first dielectric layer above the second IDT electrode.

14. The acoustic wave element according to claim 13,
wherein the second IDT electrode has a thickness larger than a thickness of the first IDT electrode.

15. An acoustic wave element comprising:
a piezoelectric body having an upper surface;
a first interdigital transducer (IDT) electrode provided on the upper surface of the piezoelectric body;
a second IDT electrode provided on the upper surface of the piezoelectric body, the first dielectric layer including a first part to cover the first IDT electrode and a second part to cover the second IDT electrode;
wherein a thickness of the first part of the first dielectric layer is smaller than a thickness of the second part of first dielectric layer, and
wherein a distance between an upper surface of the first part of the first dielectric layer and an upper surface of the first IDT electrode is larger than a thickness of the first IDT electrode.

16. The acoustic wave element according to claim 15,
wherein the second IDT electrode has a thickness larger than a thickness of the first IDT electrode.

17. An acoustic wave element comprising:
a piezoelectric body having an upper surface;
a first interdigital transducer (IDT) electrode provided on the upper surface of the piezoelectric body;
a second IDT electrode provided on the upper surface of the piezoelectric body; and
a first dielectric layer provided on the upper surface of the piezoelectric body, the first dielectric layer including a first part to cover the first IDT electrode and a second part to cover the second IDT;
wherein a thickness of the first part of the first dielectric layer is smaller than a thickness of the second part of the first dielectric layer, and
wherein the first dielectric layer has a portion whose height gradually increases from an upper surface of the first part of the first dielectric layer to an upper surface of the second part of the first dielectric layer.

18. The acoustic wave element according to claim 17, wherein the second IDT electrode has a thickness larger than a thickness of the first IDT electrode.

19. The acoustic wave element according to claim 17, further comprising a second dielectric layer provided on the first dielectric layer,
wherein a first distance is in a thickness direction between an upper surface of the first part of the first dielectric layer and an upper surface of the second part of the first dielectric layer;
wherein a second distance is in a thickness direction between an upper surface of the second dielectric layer above the first part of the first dielectric layer and an upper surface of the second dielectric layer above the second part of the first dielectric layer, and
the second distance is shorter than the first distance.

* * * * *